United States Patent [19]

Liu

[11] 4,422,091
[45] Dec. 20, 1983

[54] BACKSIDE ILLUMINATED IMAGING CHARGE COUPLED DEVICE

[75] Inventor: Yet-Zen Liu, Westlake Village, Calif.

[73] Assignee: Rockwell International Corporation, El Segundo, Calif.

[21] Appl. No.: 225,899

[22] Filed: Jan. 19, 1981

[51] Int. Cl.³ .............................................. H01L 29/78
[52] U.S. Cl. ........................................ 357/24; 357/30
[58] Field of Search ............................ 357/24 LR, 30

[56] References Cited

U.S. PATENT DOCUMENTS

| | | | |
|---|---|---|---|
| 4,228,365 | 10/1980 | Guiterrez | 357/24 LR |
| 4,257,057 | 3/1981 | Cheung | 357/24 X |
| 4,271,420 | 6/1981 | Chickamura | 257/30 |
| 4,275,407 | 6/1981 | Lorenze | 357/24 LR |

Primary Examiner—Martin H. Edlow
Attorney, Agent, or Firm—H. Fredrick Hamann; Craig O. Malin

[57] ABSTRACT

An imaging charge coupled device (CCD) is provided which has a support on the non-illuminated, circuit side of a CCD channel layer. The other side of the CCD channel layer (the semiconductor side) is epitaxially joined to an absorber layer of semiconductor which is epitaxially joined to a window layer. This structure is fabricated by growing the epitaxial semiconductor layers (window, absorber, and channel) on a semiconductor substrate, fabricating a CCD circuit on the channel layer, mounting the channel layer to a support, and finally etching off the substrate.

8 Claims, 2 Drawing Figures

BACKSIDE ILLUMINATED IMAGING CHARGE COUPLED DEVICE

STATEMENT OF GOVERNMENT INTEREST

The invention herein described was made under a contract with the Department of the Navy.

BACKGROUND OF THE INVENTION

1. Field of the Invention

This invention relates to the field of solid state electronics and particularly to the field of imaging charge coupled devices (CCDs).

2. Description of the Prior Art

Charge coupled devices (CCDs) previously used for visible imagers have typically consisted of an n-MOS Si CCD channel on a p-Si absorber. While this structure is adequate for many applications, in some specific applications the performance of Si CCD imagers is hampered by the fundamental material properties of Si and of $SiO_2$.

One such application is for star sensors which require extremely low dark currents and high optical responsivity at elevated temperatures in an irradiated environment. These goals are not likely to be realized simultaneously in a Si CCD. To achieve low dark currents in a Si CCD, long lifetime and thus long diffusion length material must be used. The diffusion length in Si is much longer than a pixel width, resulting in cross-talk between the pixels. To minimize the cross-talk, the substrate (absorber) is thinned forcing a trade-off between optical response and spatial resolution. While the 1.1 eV bandgap of Si provides a fair match to the visible spectrum, it is also the source of relatively high dark currents. Additionally, the use of an oxide and a deep active layer make Si CCDs extremely sensitive to the effects of radiation.

By making use of the well developed heteroepitaxial technology, compound semiconductors such as (GaAl)As can be used to fabricate structures in which optical absorption and charge transfer are performed in adjacent epilayers of different materials. The material properties of each region can be individually adjusted to optimize overall device performance. One of the problems encountered in applying this heteroepitaxial technology to imaging CCDs is the presence of the inactive semiconductor substrate. The substrate serves as a starting material for growth of the thin epitaxial layers and it provides a support for them. However, it has no functional role in the device operation. Because it is absorbing to the spectral region of interest, the device must be illuminated from the opposite side through the CCD channel layer. Such "frontside" illumination using transparent Schottky gates is rather complicated and has low quantum efficiency.

SUMMARY OF THE INVENTION

It is an object of the invention to provide an imaging CCD in which optical absorption and charge transfer are performed in adjacent epilayers of semiconductors.

It is an object of the invention to provide an imaging CCD which has both high optical responsivity and spatial resolution.

It is an object of the invention to provide an imaging CCD which has intrinsic radiation hardness.

It is an object of the invention to provide an imaging CCD in which the material properties of individual layers can be adjusted to optimize the overall device performance.

It is an object of the invention to provide an imaging CCD which has a low dark current.

It is an object of the invention to provide an imaging CCD which has a minimum of gate obscuration.

According to the invention, an imaging charge coupled device has a window epitaxial layer, an absorber epitaxial layer, and a CCD channel epitaxial layer. These epitaxial layers are supported by a support layer which is bonded to the CCD channel layer on the non-illuminated side of the device. The channel layer is of a different conductivity type than the absorber or window layer so that a p-n junction is created between the channel and absorber layers. The band gap of the window layer is wider than the band gap of the absorber layer, thus making it transparent to the radiation being detected.

There is no substrate layer, and radiation enters the device directly through the window layer without substrate attenuation or gate obscuration. The radiation is absorbed in the absorber layer and the resulting photogenerated carriers diffuse to the p-n junction where they are swept into the channel layer and clocked out in a known manner.

Although the finished device does not have a substrate, the growth of the epitaxial layers during fabrication requires that a substrate be used. A window layer, an absorber layer, and a CCD channel layer (in this order) are grown epitaxially on a substrate. A CCD circuit is then fabricated on the channel layer and a support is mounted on the channel layer. The substrate layer is no longer needed either to grow the epitaxial layers or to support the device, and it is etched off.

These and other objects and features of the invention will be apparent from the following detailed description, taken with reference to the accompanying drawings.

DESCRIPTION OF THE PREFERRED EMBODIMENT

Figure 1:
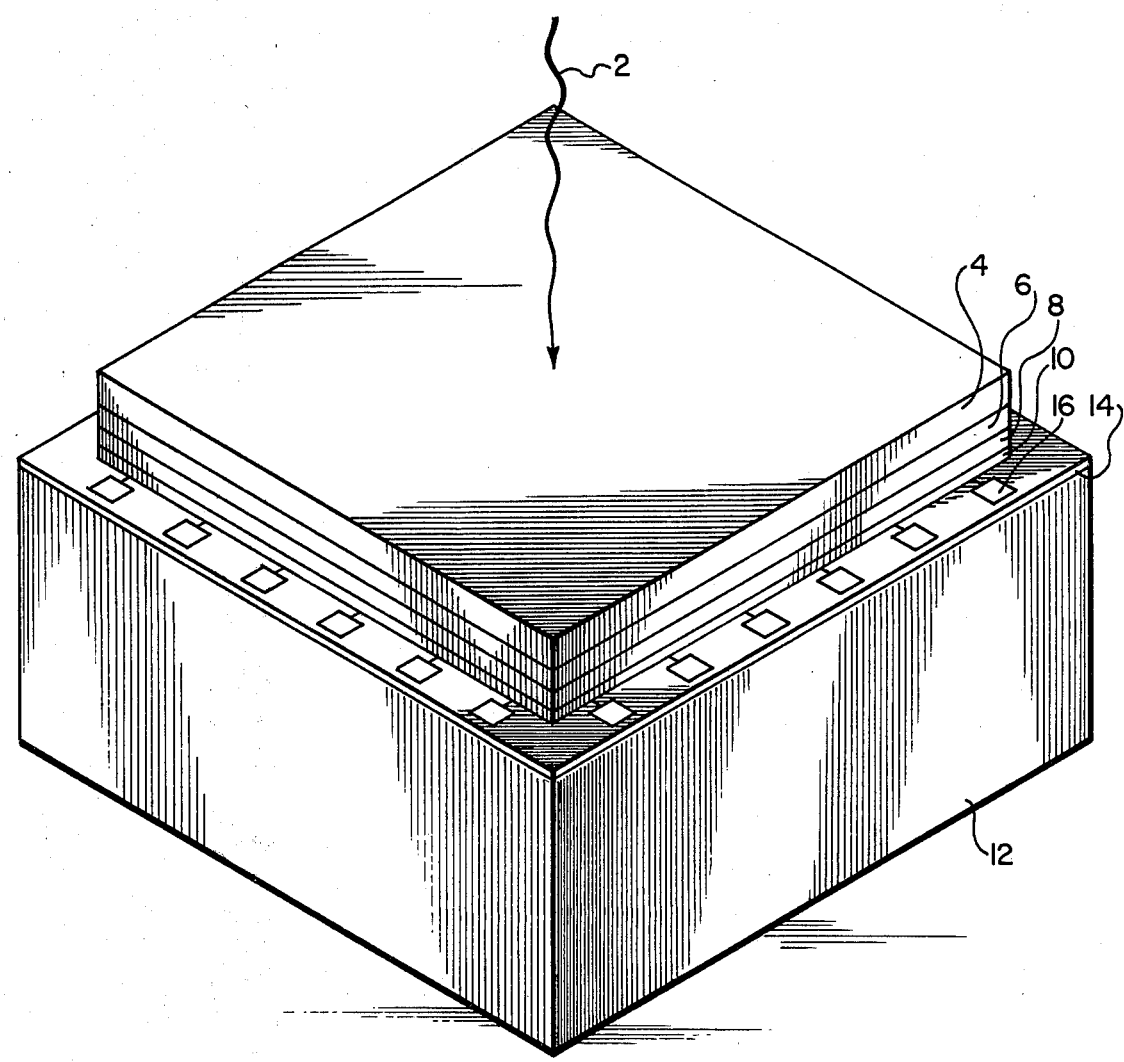
FIG. 1 is a perspective view of an imaging charge coupled device in accordance with a preferred embodiment of the invention.

FIG. 1 shows a (GaAl)As/GaAs imaging CCD according to a preferred embodiment of the invention. It is "backside" illuminated in that radiation 2 enters from the side opposite the CCD channel rather than from the CCD channel side. Radiation 2 first passes through window layer 4 of p-type conductivity $(Ga_{1-x}Al_x)As$. Window layer 4 acts as a short wavelength cut-off and serves to passivate the surface states of the next layer, absorber layer 6. Absorber layer 6 is p-type conductivity GaAs and its narrower band gap acts as a natural long wavelength cut-off. By varying the composition of the absorber and window layers, the response band of the device can be adjusted. Window and absorber region thicknesses are typically about 0.5 μm and 1.5 μm, respectively. Absorber layer 6 is designed to collect all the incoming photo signal, thereby resulting in high quantum efficiency.

Electrons which are photogenerated in absorber layer 6 diffuse into CCD channel layer 8. The intrinsically high absorption coefficient and short diffusion length of GaAs (as compared to Si) allow the absorber thickness to be much smaller than a pixel. An imaging CCD is thus possible in the (GaAl)As/GaAs system which has both high spatial resolution and high quantum efficiency.

Channel layer 8 is a $(Ga_{1-x}Al_x)As$ semiconductor having an Al content (x) which is selected to achieve low dark currents and optimize the CCD performance. An aluminum concentration of $x=0.3$ gives a low dark current. If the aluminum concentration is increased greatly beyond this amount, problems in the formation of ohmic contacts may occur. However, there is considerable freedom in the choice of aluminum concentration of the channel layer to optimize device parameters or processing ease.

The doping and thickness of channel layer 8 is chosen to optimize the signal handling capability consistent with a pinch-off voltage less than the Schottky breakdown voltage. In the device shown in FIG. 1, the thickness is about 2 $\mu$m and the doping is in the range of $1-2 \times 10^{16}$ cm$^{-3}$.

Photogenerated carriers are clocked out of channel layer 8 using known CCD circuits which are fabricated on channel layer 8 and are represented by CCD circuit layer 10 in FIG. 1. Typically, CCD circuit layer 10 includes ohmic contacts, channel isolation such as guard ring or proton bombardment, Schottky diodes, vias, interconnects, and deposits of $Si_3N_4$ insulation. "On chip electronics" such as an output amplifier can also be fabricated on channel layer 8 and included in CCD circuit layer 10.

Channel layer 8 with its CCD circuit layer 10 is bonded to support 12 by means of sealing layer 14. A wide variety of materials such as molybdenum, $Al_2O_3$, and glass can be used for the support depending upon the properties required, such as matched thermal expansion, bonding requirements, and conductivity.

In a second embodiment of the invention, support 12 is a metal deposit which is thick enough (for example 2 mils of gold) to support the thin layers of semiconductor. In a third embodiment of the invention, support 12 is a GaAs or Si chip, having its own circuit for signal conditioning and amplification already fabricated and with appropriate connecting pads aligned to the corresponding pads on circuit layer 10. This will provide a compact, high signal-to-noise ratio two-chip combination with considerable saving in weight and space for external electronics.

Sealing layer 14 is a bonding material such as a non-conducting epoxy or bonding alloy. If a conducting sealing layer support is used, then a suitable insulating material such as $Si_3N_4$ or $SiO_2$ must first be placed over CCD circuit layer 10.

In the embodiment shown in FIG. 1, the area of semiconductor layers 4, 6, and 8 is less than the area of support 12 thus providing a ledge or border upon which interconnect pads 16 are positioned. Pads 16 are extensions of CCD circuit 10. Typically they are about 4 mils square and can be readily mated to the external electronics with which the device is used.

Figure 2:
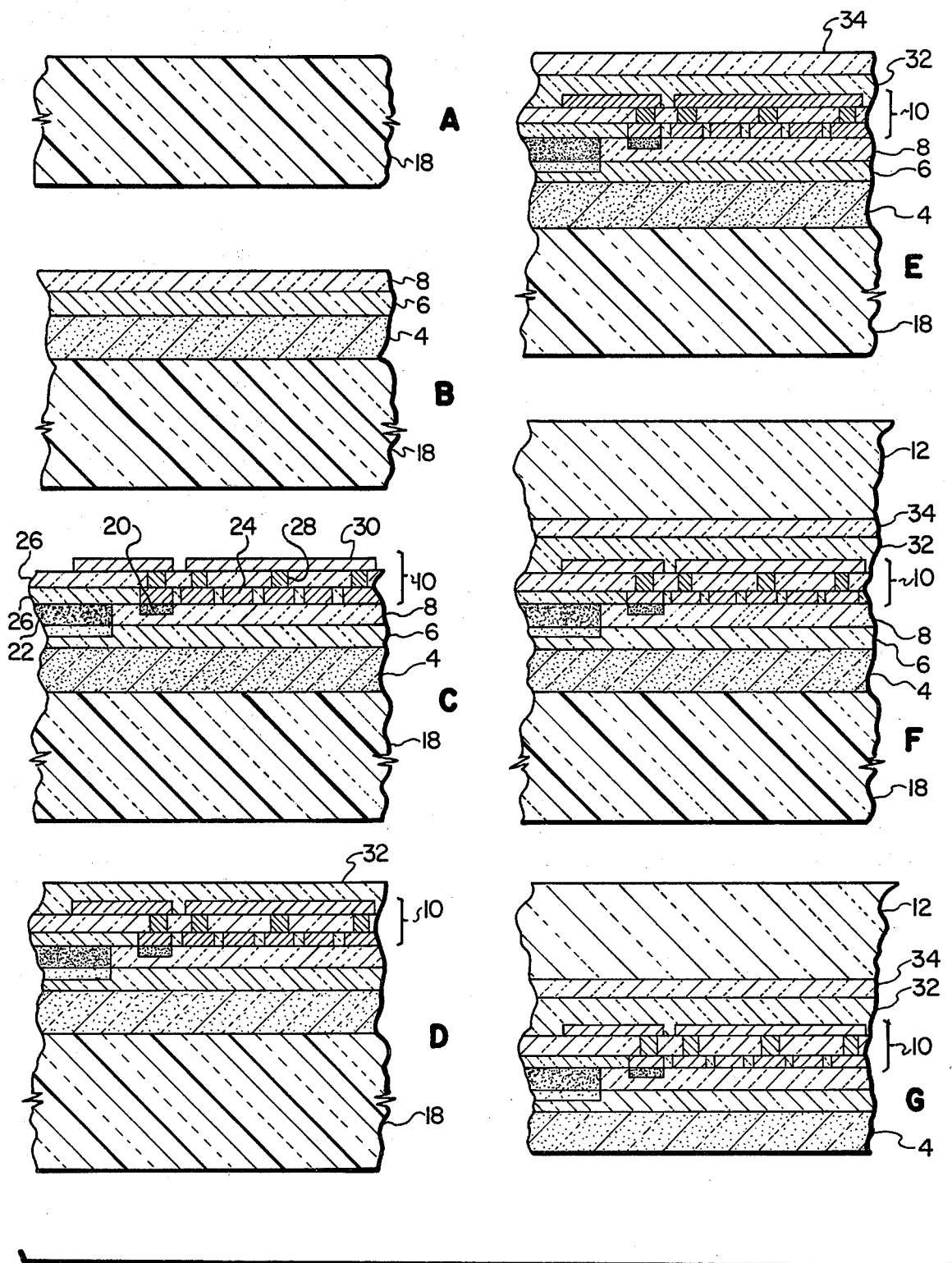
FIG. 2 is a flow chart showing an imaging charge coupled device (in partial cross section) at different stages during its fabrication.

The device shown in FIG. 1 was fabricated by the sequential deposition of liquid phase epitaxial (LPE) layers on a GaAs substrate. As shown in FIG. 2, substrate 18 is provided (step A) and then three LPE layers are deposited (step B) using conventional slider boat techniques.

The first layer is window layer 4 comprising p-type conductivity $(Ga_{1-x}Al_x)As$. The Al content (x) is selected to be transparent to the desired wavelength according to established principles. An example of a window layer is a $(Ga_{0.5}Al_{0.5})As$ composition that is 0.5 $\mu$m thick with a doping of $10^{17}$ cm$^{-3}$.

The second layer, absorber layer 6, is grown by LPE on top of window layer 4. In the present example, absorber layer 6 is about 1.5 $\mu$m thick and consists of p-type conductivity GaAs with a doping of $10^{17}$ cm$^{-3}$. This exemplary combination of a $(Ga_{0.5}Al_{0.5})As$ window and a GaAs absorber provides an imager with a spectral response of from about 0.5 $\mu$m to 0.9 $\mu$m.

The third LPE layer is CCD channel layer 8 of n-type conductivity $(Ga_{0.7}Al_{0.3})As$. The concentration of Al (x=0.3) was chosen to provide both a low dark current and good ohmic contact fabricability as previously described. In the present example, channel layer 2 is about 1-2 $\mu$m thick and has a doping of $10^{16}$ cm$^{-3}$.

As shown in step C of FIG. 2, a CCD circuit 10 is fabricated on channel layer 8 using standard photolithographic techniques. In general, this requires: (1) formation of ohmic contacts 20, (2) channel isolation 22 by proton bombardment, (3) deposition of Schottky barrier gates 24, (4) deposition of vias 28, and (5) deposition of interconnects 30. Electrical insulation 26 is provided by sputtered deposition of $Si_3N_4$ or equivalent means.

After fabrication of CCD circuit 10, an insulating or bonding material is deposited over circuit 10. This may be a single, non-conducting bonding layer such as layer 14 in FIG. 1, or it may comprise several layers such as insulating layer 32 (step D) and metal layer 34 (step E). Insulating layer 32 can be $Si_3N_4$ or $SiO_2$ which is deposited over circuit 10 to insulate and protect it. Metal layer 34 can be a metal for bonding directly to support 12 or a metal deposit which is adhesively bonded to support 12.

Several methods are available for bonding support 12 to metal deposit 34 including: a low temperature solder (In-Ga alloy), In bonding using pressure (cold In bond), silver-based epoxy, non-conducting epoxy, thermal sonic bonding with a Au-Sn alloy, and low temperature glass bonding. If a suitable non-conducting bond is used, then sealing material 32 and metal deposit 34 (steps D and E) can be eliminated.

An important advantage of this method is the fact that support 12 does not have to be transparent and can be fabricated from a material selected to provide good fabricability and optimum thermal, electrical, and mechanical match with the imager. Examples of support materials include Mo, $Al_2O_3$, and glass.

After support 12 has been bonded to the device, GaAs substrate 18 is no longer needed for support and it is etched completely away down to window layer 4 as shown in step G of FIG. 2. A selective etchant such as an aqueous solution of $H_2O_2$ and $NH_4OH$ can be used to remove the GaAs without removing the (GaAl)As.

External access to CCD circuit 10 can be provided by etching through the thin LPE layers down to interconnect pads 16. An etchant of 3 parts $H_2SO_4$ plus 1 part $H_2O_2$ and 1 part water can be used to remove the (GaAl)As and GaAs layers 4, 6, 8 without removing metal pads 16. As shown in FIG. 1, the etchant can be confined to the periphery of the device to provide a border supporting interconnect pads 16.

To facilitate production, a relatively large area, multilayer wafer can be prepared as shown in FIG. 2, and then smaller, individual devices cut from the larger wafer by "dicing" it.

In a second embodiment of the invention, metal deposit 34 is made sufficiently thick (at least 2 mils) to provide support for the thin LPE layers (step E). Then, separate support 12 is not required and the substrate can be etched off without going through step F.

Numerous variations and modifications can be made without departing from the invention. For example, other semiconductors could be used to fabricate the LPE layers. The conductivity type of the semiconductors could be reversed. Isolation of the CCD circuit can be provided by the more conventional guard ring technique rather than by proton bombardment. Accordingly, it should be clearly understood that the form of the invention described above and shown in the accompanying drawings is illustrative only and is not intended to limit the scope of the invention.

What is claimed is:

1. An imaging charge coupled device (CCD) comprising:
   a first layer of supporting material;
   a second layer of semiconductive material of a first conductivity type having a CCD circuit on one side, said one side being bonded to said first layer;
   a third layer of semiconductive material of a second conductivity type epitaxially joined to the other side of said second layer; and
   a fourth thin layer of semiconductive material of said second conductivity type epitaxially joined to said third layer, said semiconductive material forming said fourth layer having a wider bandgap than said semiconductive material forming said third layer so that said fourth layer is a window for said third layer;
   said imaging CCD not having a substrate, whereby the support for said device is provided by said first layer.

2. The device as claimed in claim 1, including a layer of insulating material between said first and second layers.

3. The device as claimed in claim 2, wherein said first layer comprises a metal layer.

4. The device as claimed in claim 1, wherein said first layer comprises a semiconductor chip having a circuit which is electrically coupled to said CCD circuit.

5. The device as claimed in claim 1, wherein said first layer extends outwardly to form a border around the periphery of said second layer and said CCD circuit includes interconnect pads on said border.

6. The device as claimed in claim 1, wherein said second layer comprises an n-type (GaAl)As semiconductor, said third layer comprises a p-type GaAs semiconductor, and said fourth layer comprises a p-type (GaAl)As semiconductor.

7. An imaging charge coupled device (CCD) comprising:
   an epitaxial layer of a first conductivity type (GaAl)As having an aluminum content suitable for a CCD circuit;
   a CCD circuit on one side of said first conductivity typ (GaAl)As;
   a layer of support material bounded to said one side of said first conductivity type (GaAs)As;
   an epitaxial layer of a second conductivity type GaAs on the other side of said first conductivity type (GaAl)As to provide an absorber layer for said imaging CCD; and
   an epitaxial layer of a second conductivity type (GaAl)As on said second conductivity type GaAs, the Al content of said second conductivity type (GaAl)As being selected to be transparent to the desired wavelength of said imaging CCD.

8. The imaging CCD as claimed in claim 7, wherein said layer of first conductivity type (GaAl)As comprises n-type $(Ga_{0.7}Al_{0.3})As$, said layer of second conductivity type GaAs comprises p-type GaAs, and said layer of second conductivity type (GaAl)As comprises p-type $(Ga_{0.5}Al_{0.5})As$.

* * * * *